(12) United States Patent
Gau

(10) Patent No.: US 6,245,625 B1
(45) Date of Patent: Jun. 12, 2001

(54) FABRICATION METHOD OF A SELF-ALIGNED CONTACT WINDOW

(75) Inventor: Jing-Horng Gau, Hsinchu Hsien (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/336,553

(22) Filed: Jun. 19, 1999

(51) Int. Cl.[7] .................................................. H01L 21/336
(52) U.S. Cl. ........................ 438/305; 438/639; 438/595
(58) Field of Search ................................. 438/639, 595, 438/FOR 199, FOR 355, FOR 196, 305, FOR 188

(56) References Cited

U.S. PATENT DOCUMENTS

| | | | |
|---|---|---|---|
| 5,817,562 | * | 10/1998 | Chang et al. . |
| 5,994,192 | * | 11/1999 | Chen . |
| 6,004,853 | * | 12/1999 | Yang et al. . |
| 6,010,954 | * | 1/2000 | Ho et al. . |
| 6,057,196 | * | 5/2000 | Gau . |
| 6,083,828 | * | 7/2000 | Lin et al. . |

* cited by examiner

Primary Examiner—George Fourson
Assistant Examiner—Joannie Adelle Garcia
(74) Attorney, Agent, or Firm—Martine Penilla & Kim, LLP

(57) ABSTRACT

A method of fabricating a self-aligned contact window structure is described in which a substrate is provided with a plurality of gates formed on the substrate and a plurality of lightly doped regions is formed in the substrate on both sides of the gate. A first dielectric layer of a certain thickness is then formed on the substrate with the surface of the first dielectric layer being lower than the surfaces of the gates such that the sidewalls of the gates are partially exposed. A plurality of spacers is further formed on the exposed sidewalls of the gates. Using the gates and the spacers as masks, the first dielectric layer is anisotropically etched until the lightly doped regions are partially exposed. Using the gate and the spacer as masks, a plurality of heavily doped regions is formed in the lightly doped region and in the substrate. A second dielectric layer is formed covering the gates. The second dielectric is then defined to form a self-aligned contact window.

17 Claims, 4 Drawing Sheets

FABRICATION METHOD OF A SELF-ALIGNED CONTACT WINDOW

BACKGROUND OF THE INVENTION

1. Field of the Invention

The present invention relates to a fabrication method of a semiconductor device. More particularly, the present invention relates to a fabrication of a self-aligned contact window (SAC).

2. Description of the Related Art

In the conventional fabrication method of a self-aligned contact window, a silicon oxide layer is formed between a silicon nitride spacer and a word line gate. During the etching process to form a self-aligned contact window, if a misalignment occurs in process of defining the self-aligned contact window, formation of a trench in the silicon oxide layer located between the silicon nitride spacer and the word line gate may result.

FIG. 1 is a schematic, cross-sectional view of a self-aligned contact window according to the prior art. As shown in FIG. 1, a word line gate 110, comprising a gate oxide layer 102, a polysilicon layer 104, a tungsten silicide layer 106 and a silicon nitride roof layer 108, is formed on a semiconductor substrate 100. A silicon oxide layer 114 is further formed between a silicon nitride spacer 112 and the word line gate 110 to improve the adhesion between the silicon nitride spacer 112 and the word line gate 110. A silicon oxide layer 116 is deposited to cover the word line gate 110 and to insulate the word line gate 110 from the bit line formed in a latter part of the process. After this, a silicon oxide layer 116 is defined to from a self-aligned contact window 118. However, if the silicon oxide layer 114 formed between the silicon nitride spacer 112 and the word line gate 110 is too thick, etching is likely to occur along the silicon oxide layer so that a trench 120 is formed during the SAC 118 etching. More seriously, the tungsten silicide layer 106 is exposed. Furthermore, before the bit line is formed, a wet chemical wash with, for example, RCA solution is conducted and results in an additional portion of the silicon oxide layer being rinsed off during the wash, which enhances the possibility of exposing the tungsten silicide layer 106. As a result, a bit line formed in a latter part of the process is electrically connected to the source/drain region 114, leading to an electrical connection between the word line gate 110 and the bit line, giving rise to a short circuit.

A conventional approach in resolving the above problem is to reduce the thickness of the buffer silicon oxide layer 114. The possibility of forming the trench 120 due to etching of the silicon oxide layer 114 in between the silicon nitride spacer 112 and the world line gate 104 is thereby reduced. However, another problem may arise with the conventional approach. Since the thickness of the silicon oxide layer 114 is reduced, the distance between the silicon nitride spacer 112 and the substrate 100 is decreased, inducing stresses between the silicon nitride spacer 112 and the silicon oxide layer 114 or between the silicon nitride spacer 112 and the substrate 100. As a result, a dislocation may occur in the substrate 100, which has a single crystal structure.

Another approach to mitigate the problem occurred in the conventional practice is to induce a reaction on the exposed surfaces of the silicon, polysilicon and tungsten silicide to form silicon oxide via a thermal oxidation in order to prevent the stress issue with the silicon nitride spacer. A short circuit due to an electrical connection between the word line gate 110 and the bit line is also prevented. Silicon nitride, however, does not react to form silicon oxide. In addition, a thermal oxidation treatment further subjects the device to an addition thermal cycle, which strongly affects the characteristics of the device and easily induces a dislocation in the substrate 100, which has a single crystal structure.

SUMMARY OF THE INVENTION

The current invention provides a fabrication method of a self-aligned contact window in which a substrate, with a gate and a lightly doped region already formed on the substrate, comprises a first dielectric layer with a thickness of 300–500 Å. The upper surface of the first dielectric layer is lower than the upper surface of the gate, which completely reveals the roof layer of the gate. A spacer is further formed on the exposed sidewall of the gate. Using the gate and the spacer as masks, the first dielectric layer is etched until the lightly doped region is partially exposed. Still using the gate and the spacer as masks, a heavily doped region is formed in the lightly doped region and the substrate. Consequently, a second dielectric layer is formed covering the gate. Using the spacer of the gate and the roof layer of the gate as masks, the second dielectric layer is then defined to form a self-aligned contact window.

By insulating the silicon nitride spacer from the substrate with a silicon oxide layer, the silicon nitride spacer is not in direct contact with the substrate. As a result, a dislocation in the substrate resulting from a stress caused by direct contact of the silicon nitride spacer with the substrate, which commonly occurs in the conventional practice, is prevented.

Furthermore, the need to form a silicon oxide layer between the spacer and the gate is eliminated in the present invention. As a result, a trench cannot be formed along the silicon oxide layer during a SAC etching. A short circuit resulting from an electrical connection between the bit line and the word line gate is also prevented.

In addition, according to the current invention, the silicon nitride spacer is not in direct contact with the substrate; therefore, the use of thermal oxidation to form a silicon oxide layer, as in the conventional practice, can be avoided. As a result, the problem of a dislocation in the substrate due to a thermal treatment is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2G are schematic, cross-sectional views of a self-aligned contact window showing the manufacturing process of a self-aligned contact window according to the present invention.

Figure 1:
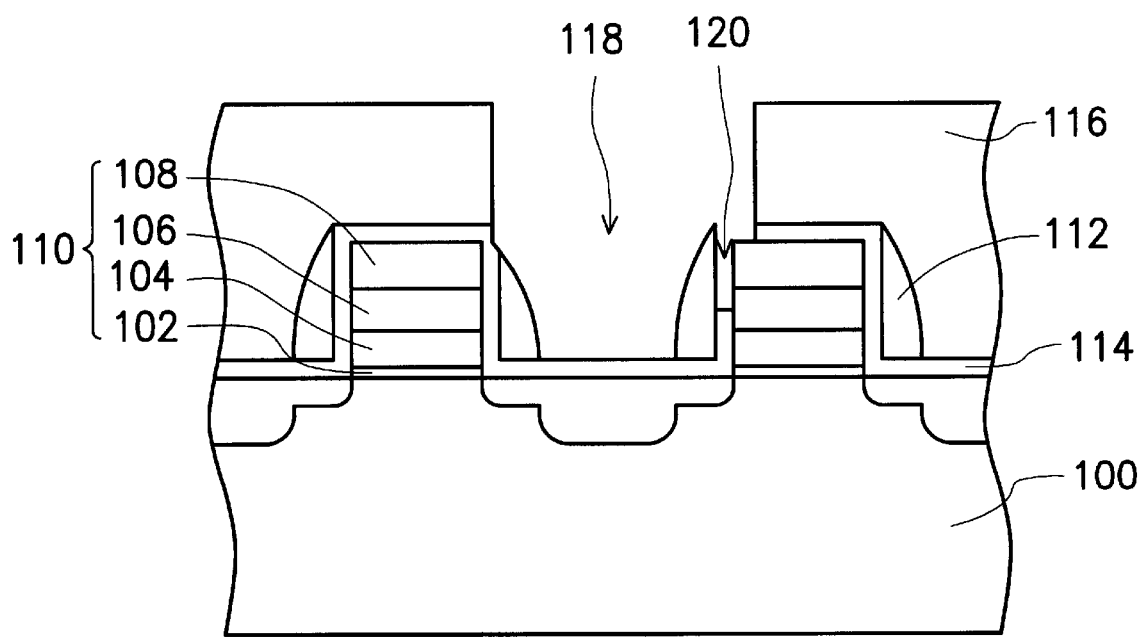
FIG. 1 is a schematic, cross-sectional view of a self-aligned contact window according to the prior art.
Figure 2A:
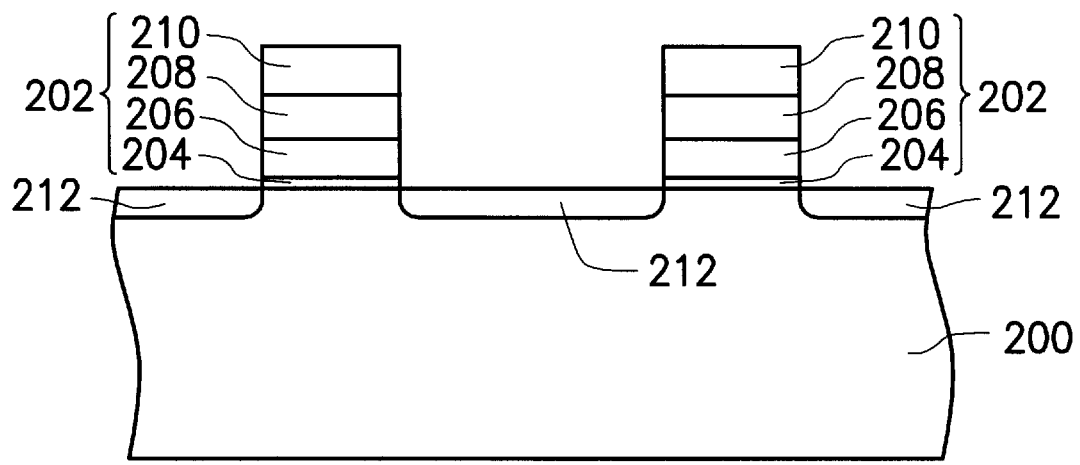
FIGS. 2A to 2G are schematic, cross-sectional views of a self-aligned contact window showing the manufacturing process of a self-aligned contact window according to the present invention.

Referring to FIG. 2A, a substrate 200 is provided, which is, for example, a semiconductor silicon substrate. A gate 202 is formed as a word line on the substrate 200. The gate 202 is formed by methods including forming a gate oxide layer 204 on the substrate 200. A doped polysilicon layer 206 is then formed on the gate oxide layer 204, followed by forming a metal silicide layer 208 on the doped polysilicon layer 206. After this, a roof layer 210 is formed on the metal silicide layer 208. These layers are defined to form the gate 202. The roof layer 210, which includes a silicon nitride layer, is formed by a process such as chemical vapor deposition. Using the roof layer 210 as a mask, an ion implantation is conducted to form a lightly doped region 212 in the substrate 200 on both sides of the gate 202. The type of ions used depends on whether an N-type or a P-type metal oxide semiconductor is being formed.

Figure 2B:
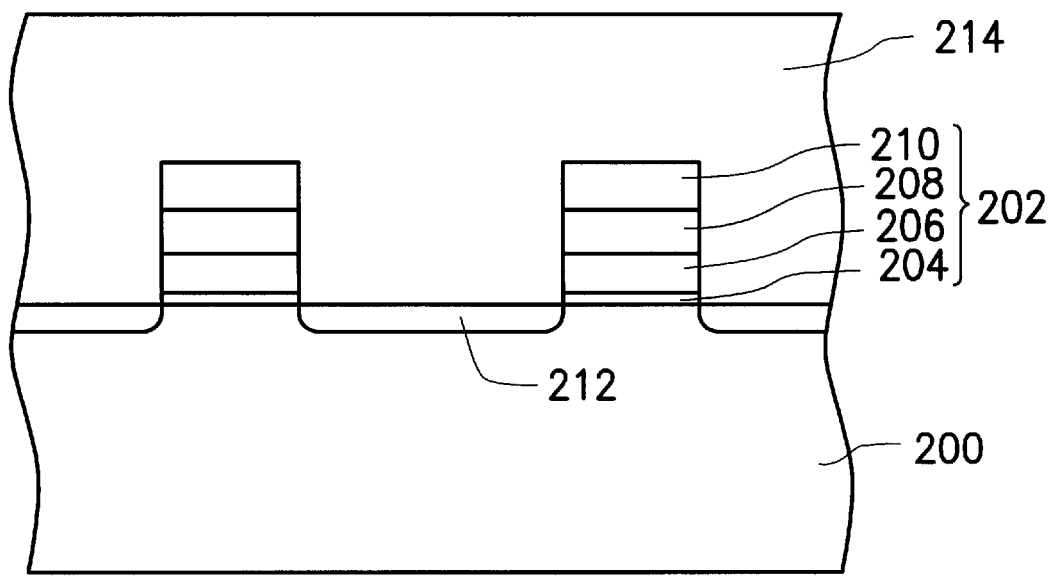

According to FIG. 2B, a planarized dielectric layer 214 is formed on the substrate 200 covering the gate 202. The dielectric layer 214, such as a silicon oxide, is planarized by a process including chemical mechanical polishing (CMP).

Figure 2C:
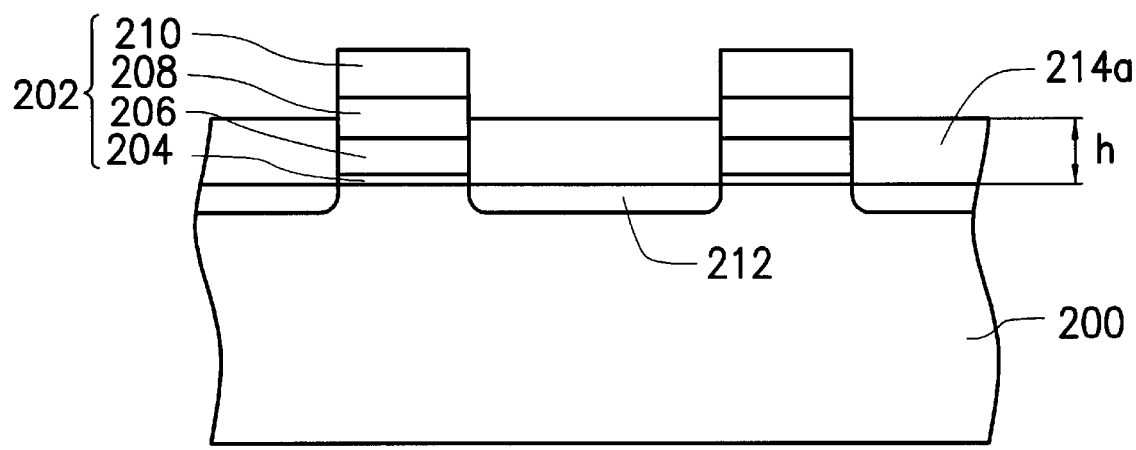

According to FIG. 2C, a portion of the dielectric layer 214 is removed until the remaining thickness, indicated as the dielectric layer 214a, is approximately 300 to 500 Å thick, and the roof layer 210 is exposed entirely. Suitable methods of removing the dielectric layer 214 include a wet etching process. A portion of the sidewall of the gate 202 is exposed since the surface of the dielectric layer 214a after etching is lower than the surface of the gate 202.

Figure 2D:
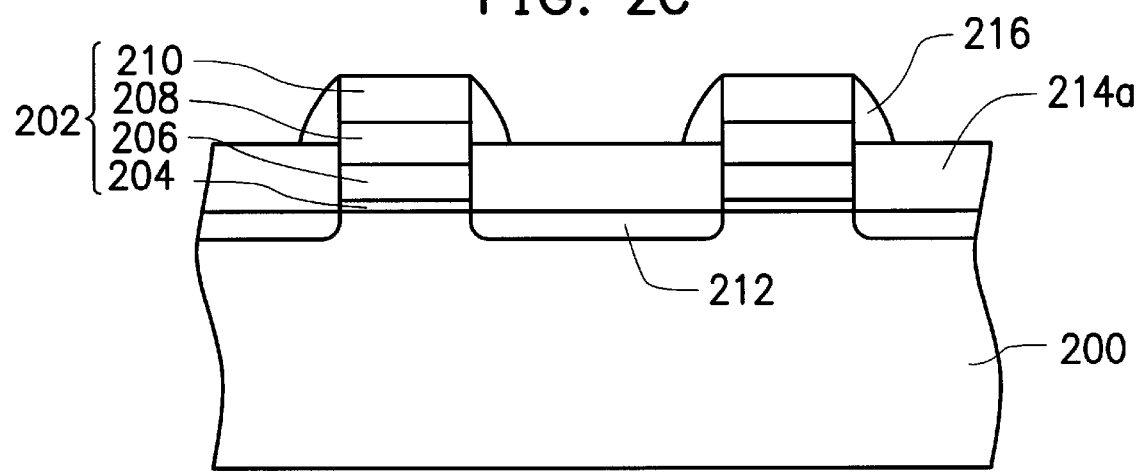
Figure 2E:
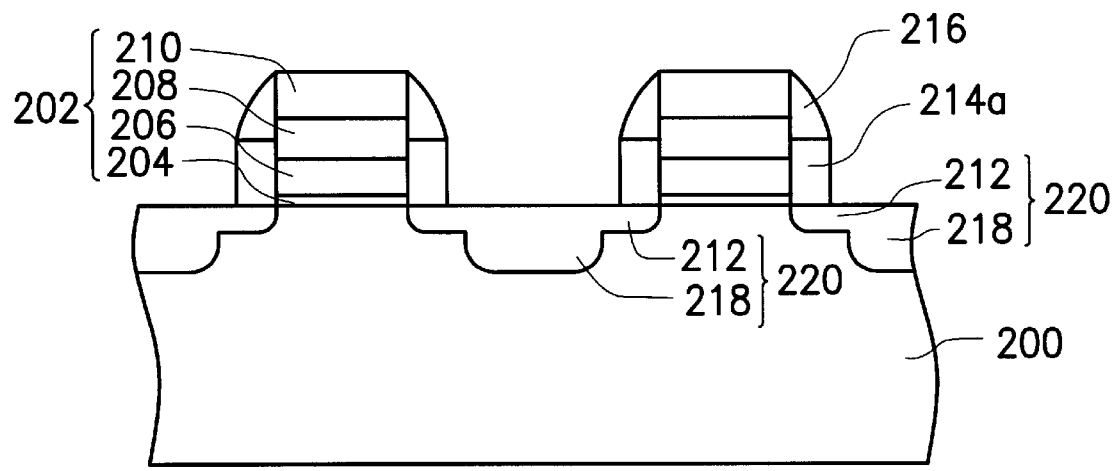

As shown in FIG. 2D, a spacer 216 is formed on the exposed sidewall of the gate 202. The spacer 216, including material such as silicon nitride, is formed by a process including chemical vapor deposition of a silicon nitride layer on the gate 202 and the substrate 200, followed by etching back the silicon nitride layer.

Figure 2F:
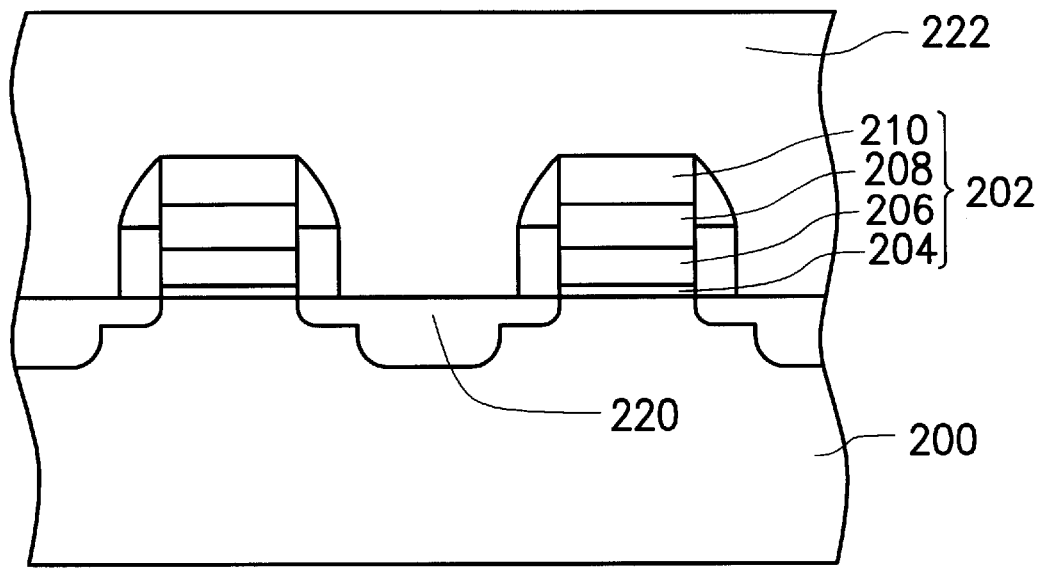

According to FIG. 2F, using the gate 202 and the spacer 216 as masks, an anisotropic etching is conducted on the dielectric layer 214a until a portion of the lightly doped region 212 is exposed. Since the substrate 200 is insulated from the silicon nitride spacer 216 by the remaining dielectric layer 214a, a dislocation in the substrate 200 due to the stress caused by direct contact of the silicon nitride spacer 216 with the substrate 200 is prevented.

Further using the gate 202 and the spacer 216 as masks, an ion implantation is conducted on the lightly doped region and the substrate 200 to form a heavily doped region 218. The lightly doped region 212 and the heavily doped region 218 together form a source/drain region 220 comprising a lightly doped drain (LDD).

As shown in FIG. 2F, another dielectric layer 222, for example, silicon oxide, is formed by methods including a chemical vapor deposition method to cover the entire substrate 200. The dielectric layer 222 is used to insulate the word line gate 202 from the subsequently formed bit line.

Figure 2G:
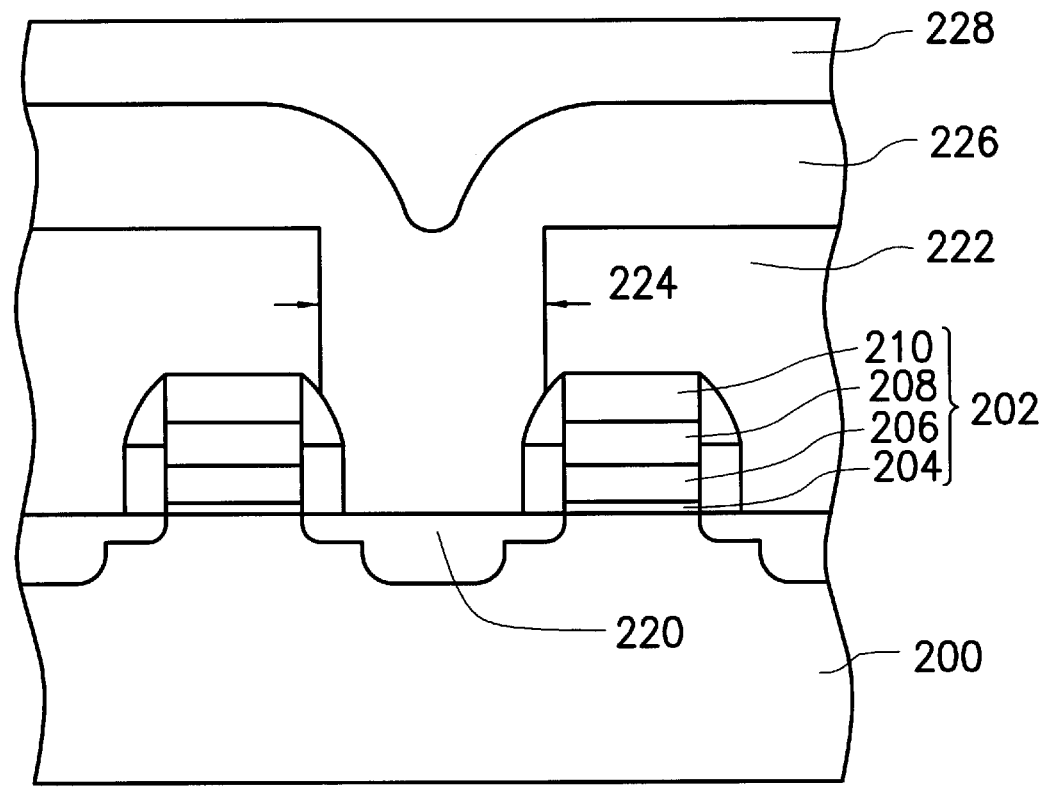

Referring to FIG. 2G, the dielectric layer 222 is defined to form a self-aligned contact window 224 by a photolithography technique, exposing the source/drain region 220. After this, a polysilicon layer 226 is formed on the substrate 220, filling in the contact window 224 and connecting electrically to the source/drain region 220. A metal silicide layer 228 can be further formed on the polysilicon layer 226 to lower the resistance. The polysilicon layer 226 and the metal silicide layer 228 are subsequently patterned to form a bit line.

Although the present invention has been described in the above embodiment with respect to a source/drain region comprising a lightly doped drain structure, the invention is also applicable to a source/drain region with a medium doped drain (MDD) structure. The invention is further applicable to a source/drain region with a heavily doped drain (HDD) structure or to other structures with similar properties.

According to the current invention of the fabrication of a self-aligned contact window, the formation of a silicon oxide layer between the spacer and the gate is not required to increase the adhesion between the silicon nitride spacer and the gate. As a result, a trench formed along the silicon oxide layer during a SAC etching is avoided, thereby preventing the exposure of the conductive layer such as the metal silicide layer or the polysilicon layer of the gate. A short circuit due to an electrical connection between the bit line and the word line gate is thereby prevented.

In light of the forgoing, an advantage of the present invention is the formation of a silicon oxide layer to insulate the substrate from the silicon nitride spacer, thereby avoiding direct contact between the silicon nitride spacer and the substrate. A dislocation in the substrate resulting from the stress caused by direct contact of the silicon nitride spacer with the substrate as in the prior art is thereby prevented.

In addition, a silicon oxide layer need not be formed between the spacer and the gate according to the present invention. A trench formed along the silicon oxide layer during a SAC etching is avoided, thereby preventing a short circuit resulting from an electrical connection between the bit line and the word line gate while the bit line is filling in the trench.

Furthermore, the silicon nitride spacer is not in direct contact with the substrate. Thus, the problem of a dislocation in the substrate resulting from the high temperature during the formation of silicon oxide in a thermal oxidation process, as used by the prior art, is also prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a self-aligned contact window, comprising the steps of:

providing a semiconductor substrate with a plurality of gates formed on the substrate and a plurality of lightly doped regions formed in the substrate on both sides of the gates, wherein the gates comprise a gate oxide layer, a doped polysilicon layer, a metal silicide layer, and a roof layer;

forming a first dielectric layer with a certain thickness on the substrate, such that the upper surface of the first dielectric layer is lower than the upper surfaces of the gates and fully exposing the roof layers of the gates;

forming a plurality of spacers on the exposed sidewalls of the gates;

conducting an anisotropic etching on the first dielectric layer until a portion of the lightly doped region is exposed, with the gates and the spacers serving as masks;

forming a plurality of heavily doped regions in the lightly doped region and in the substrate, with the gates and the spacers serving as masks;

forming a second dielectric layer covering the gates; and defining the second dielectric layer to form a self-aligned contact window.

2. The fabrication method of a self-aligned contact window according to claim 1, wherein the first dielectric layer is approximately 300–500 Å thick.

3. The fabrication method of a self-aligned contact window according to claim 1, wherein a method of forming the first dielectric layer comprises the steps of:
   forming a planarized third dielectric layer on the substrate to cover the gates; and
   removing the third dielectric layer until its remaining thickness is same as that of the first dielectric layer.

4. The fabrication method of a self-aligned contact window according to claim 3, wherein the third dielectric layer is partially removed by a process such as wet etching.

5. The fabrication method of a self-aligned contact window according to claim 3, wherein the third dielectric layer is planarized by a process including chemical mechanical polishing.

6. The fabrication method of a self-aligned contact window according to claim 3, wherein the third dielectric layer includes silicon oxide.

7. The fabrication method of a self-aligned contact window according to claim 3, wherein the first dielectric layer is approximately 300–500 Å thick.

8. The fabrication method of a self-aligned contact window according to claim 1, wherein the first dielectric layer includes silicon oxide.

9. The fabrication method of a self-aligned contact window according to claim 1, wherein the spacer includes silicon nitride.

10. The fabrication method of a self-aligned contact window according to claim 9, wherein forming the spacer further comprises the steps of:
    forming a silicon nitride layer on the substrate; and
    etching back the silicon nitride layer to form the spacers on the sidewalls of the gates.

11. The fabrication method for a self-aligned contact window according to claim 1. wherein fabricating the self-aligned contact window further includes forming a bit line on the second dielectric layer and in the self-aligned contact window.

12. The fabrication method of a self-aligned contact window according to claim 1, wherein the bit line includes a polysilicon layer and a metal silicide layer.

13. The fabrication method of a self-aligned contact window according to claim 1, wherein the roof layer includes silicon nitride.

14. A fabrication method of a self-aligned contact window, comprising the steps of:
    providing a substrate with a gate formed on the substrate, wherein the gate comprises at least a roof layer;
    forming a planarized first dielectric layer on the substrate covering the gate;
    removing a portion of the planarized first dielectric layer until a surface of a remaining planarized first dielectric layer is lower than a surface of the gate and exposes the roof layer of the gate;
    forming a spacer on an exposed sidewall of the gate;
    defining the remaining planarized first dielectric layer until the substrate is partially exposed, with the gate and the spacer serving as masks;
    forming a second dielectric layer to cover the gate; and
    defining the second dielectric layer to form a self-aligned contact window.

15. The fabrication method of a self-aligned contact window of claim 14, wherein the remaining planarized first dielectric layer is approximately 300–500 Å thick.

16. The fabrication method of a self-aligned contact window according to claim 14, wherein the portion of the planarized first dielectric layer is removed by a wet etching process.

17. The fabrication method of a self-aligned contact window according to claim 14, wherein the spacer includes silicon nitride.

\* \* \* \* \*